United States Patent [19]
Peeters et al.

[11] Patent Number: 6,116,756
[45] Date of Patent: Sep. 12, 2000

[54] MONOLITHIC SCANNING LIGHT EMITTING DEVICES

[75] Inventors: Eric Peeters, Fremont; Decai Sun, Sunnyvale; G. A. Neville Connell; Ross D. Bringans, both of Cupertino; Raj B. Apte, Palo Alto; Thomas L. Paoli, Los Altos; Patrick Y. Maeda, Mountain View; David K. Fork, Los Altos, all of Calif.; Joel A. Kubby, Rochester, N.Y.; Philip D. Floyd, Sunnyvale, Calif.

[73] Assignee: Xerox Corporation, Stamford, Conn.

[21] Appl. No.: 09/173,329

[22] Filed: Oct. 15, 1998

Related U.S. Application Data

[60] Provisional application No. 60/069,674, Dec. 12, 1997.

[51] Int. Cl.[7] .................................................... F21V 21/00
[52] U.S. Cl. ........................... 362/285; 362/286; 362/259
[58] Field of Search .................................... 362/285, 287, 362/418, 429, 259, 286; 372/50

[56] References Cited

U.S. PATENT DOCUMENTS

| | | | |
|---|---|---|---|
| 5,025,346 | 6/1991 | Tang et al. | 361/283 |
| 5,536,988 | 7/1996 | Zhang et al. | 310/309 |
| 5,628,917 | 5/1997 | MacDonald et al. | 216/2 |
| 5,640,133 | 6/1997 | MacDonald et al. | 333/197 |
| 5,719,891 | 2/1998 | Jewell | 372/45 |
| 5,747,366 | 5/1998 | Brillouet et al. | 438/44 |
| 5,764,671 | 6/1998 | Lebby et al. | 372/45 |

OTHER PUBLICATIONS

"Fabrication of Submicron High–Aspect–Ratio GaAs Actuators", by Z. Lisa Zhang & Noel C. MacDonald, Journal of Microelectromechanical Systems, vol. 2, No. 3, Jun., 1993, pp. 66–73.

"Laterally Driven Polysilicon Resonant Microstructures", by William C. Tang, Tu–Cuong H. Nguyen and Roger T. Howe, Proceedings IEEE Micro Electro Mechanical Systems, pp. 53–59, Feb., 1989.

"Electrostatic–comb Drive of Lateral Polysilicon Resonators", by William C. Tang, Tu–Cuong H. Nguyen, Michael W. Judy & Roger W. Howe, Transducers '89, Proceedings of the 5th International Conference on Solid–State Sensors and Actuators and Eurosensors III, vol. 2, pp. 328–331, Jun., 1990.

U.S. Patent Application No. 08/761,681, entitled "Raster Output Scanner with Pivotal Mirror for Process Direction Light Spot Position Control" filed on Dec. 6, 1996.

U.S. Patent Application No. 08/940,867, entitled "Highly Compact Vertical Cavity Surface Emitting Lasers" filed Sep. 30, 1997.

*Primary Examiner*—Y. Quach

[57] ABSTRACT

A micro-machined movable light emitting assembly is formed on or from an undoped or pure III-V substrate or formed on or from a doped III-V substrate. The movable light emitting assemblies are to be actuated using force generators, to generate the various mechanical degrees of freedom depending on the type of stage suspension and actuation.

20 Claims, 22 Drawing Sheets

MONOLITHIC SCANNING LIGHT EMITTING DEVICES

This patent application claims priority to Provisional Patent Application, Ser. No. 60/069,674, entitled "Monolithic Scanning VCSELS Using III-V Micromachining filed on Dec. 12, 1997. The present invention is drawn to semiconductor light emitters formed on mechanically suspended, moveable light emitter supports. This is accomplished by micromachining semiconductor materials to produce monolithic steerable light emitters.

Solid state semiconductor light emitters are important devices in such diverse applications such as optoelectronic communication systems and high-speed printing systems. It is well-known in the proven art of silicon to provide suspension and actuation schemes, for example, comb drives using bending springs or parallel plate actuation using torsion springs. For optical beam steering applications, these silicon steering elements are typically combined with a light source in a separate package, or even with a light source 'glued' or bonded onto the silicon steering chip.

U.S. Pat. Nos. 5,536,988, 5,640,133, 5,025,346, "Fabrication of Submicron High-Aspect-RatioGaAs Actuators" Zhang et al., Journal of Microelectromechanical Systems Vol. 2, No.2, p. 66–73, June 1993, "Laterally Driven Polysilicon Resonant Microstructure" Tang et al., IEEE Micro Electro Mechanical Systems pp. 53–59, February 1989 (reprint), and "Electrostatic-comb Drive of Lateral Polysilicon Resonators" Tang et al., Transducers '89, Proceedings of the 5th International Conference on Solid-State Sensors and Acutators and Eurosensors III, Vol. 2, pp. 328–331, June 1990 (reprint) show the state of the art of microelectromechanical systems (MEMS) actuators and methods of fabricating these devices. U.S. Pat. Nos. 5,747,366 and 5,719,891 show the state of the art of semiconductor light emitting assemblies.

U.S. patent application Ser. No. 08/761,681, entitled "Raster Output Scanner with Pivotal Mirror for Process Direction Light Spot Position Control" filed on Dec. 12, 1996 and assigned to the same assignee as the present invention teaches a MEMS torsional control device.

U.S. patent application Ser. No. 08/940,867, entitled "Highly compact Vertical Cavity Surface Emitting Lasers" filed on Sep. 30, 1997 and assigned to the same assignee as the present invention teaches the formation of highly compact and well-defined VCSELs.

All of the above references are hereby incorporated by reference.

SUMMARY OF THE INVENTION

The present invention is drawn to micromachining a semiconductor substrate to produce light sources on mechanically suspended, moveable micro-stages on a chip. Preferably the semiconductor substrate is made of III-V materials which have highly desirable optical properties for the production of the light source. The monolithic stages are to be actuated using force generators, to generate the various mechanical degrees of freedom depending on the type of stage suspension (e.g. x-motion, x/y motion, z-motion, Θ-motion, or possibly some combinations thereof). In one embodiment, undoped III-V materials are used as the substrate for better enabling electrical isolation for different parts of the micromachining device. In another embodiment, doped III-V materials are used for the semiconductor substrate.

DETAILED DESCRIPTION OF THE INVENTION

Figure 1:
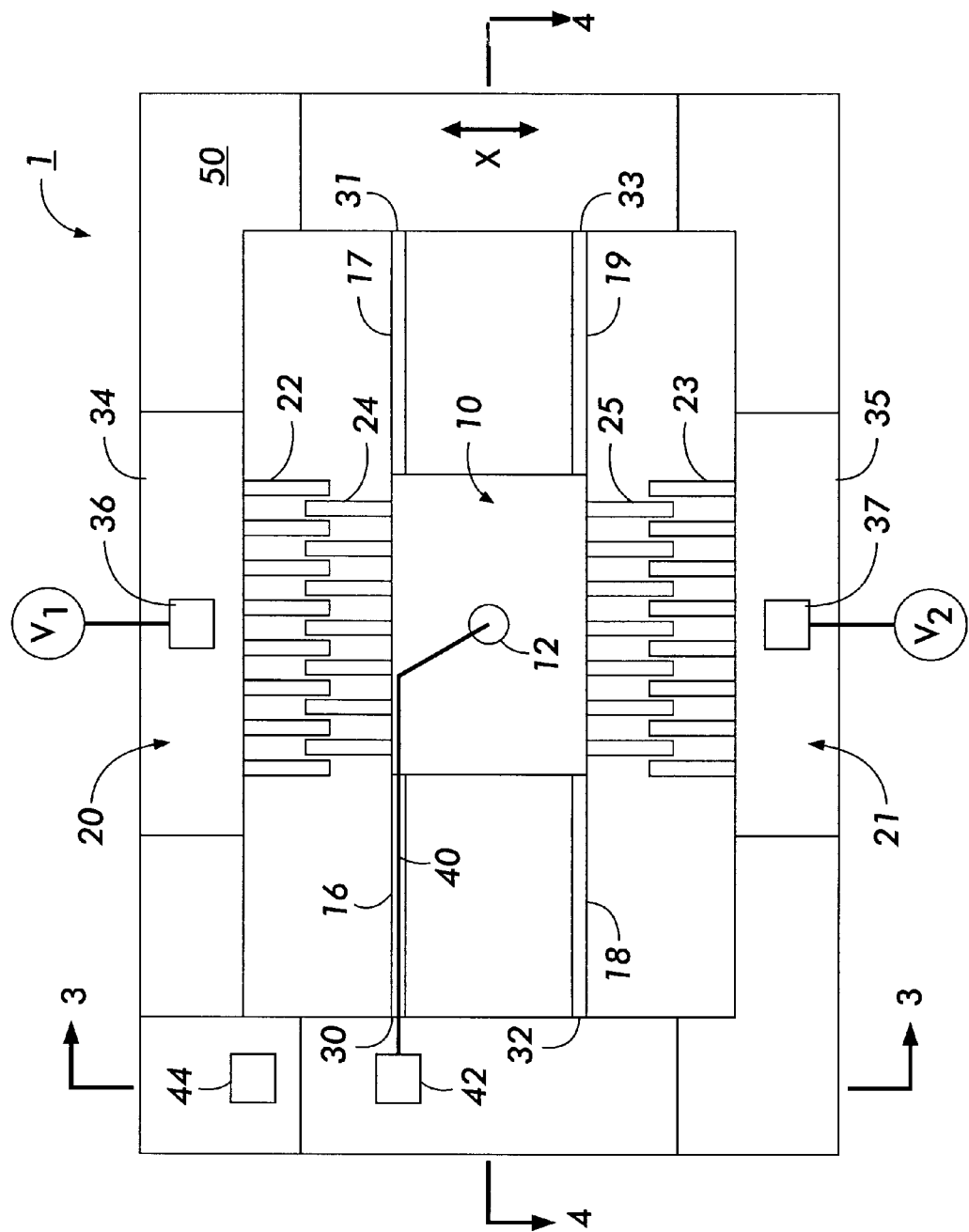
FIG. 1 shows a top view of a light emitting assembly movably supported on a semiconductor substrate.

FIG. 1 is a top view of a micromachined movable stage with a light emitter, actuation mechanism and suspension system. The light emitter preferably takes the form of any III-V based emitters, for example, vertical cavity surface emitting lasers (VCSELS), light emitting diodes (LEDS), and edge emitting light emitters. In the particular embodiment shown in FIG. 1, VCSEL shuttle 1 has movable VCSEL stage 10 which supports VCSEL 12. Stage 10 has one mechanical degree of freedom (x) and is suspended with springs 16–19. Springs 16–19 may take the form of straight bending springs (as shown), and may also include other configurations known from the silicon art, for example, folded beams. Mechanical designs such as 'folded spring' suspensions, tapered or stepped comb fingers, x/y folded spring suspensions, archimedian spiral springs for a rotational degree of freedom, etc., which are well-known in silicon structures, may be implemented in the III-V structures. The in-plane shape of structures (stage, springs, combs) is relatively arbitrary within fairly wide limits.

Movement of stage 10 is actuated with electrostatic comb drives 20 and 21, all anchored to substrate 50. Electrostatic comb drives may be replaced with any actuation system as is well known in the microelectromechanical systems (MEMS) art, for example, magnetic, thermal and piezoelectric systems. As shown, stage 10 is moved by applying voltage V1 between fixed fingers 22 and movable fingers 24 of comb drive 20 and applying a voltage V2 between fixed fingers 23 and movable fingers 25 of comb drive 21.

Electrostatic forces cause movable fingers 24 and 25 of comb drives 20 and 21 to 'pull in' to minimize the energy stored in the system. Movable fingers 24 and 25 are attached to stage 10 with its integrated VCSEL 12 and stage 10 is suspended with flexible springs 16–19. Springs 16–19 are anchored to substrate 50 at anchor points 30–33, while fixed combs 22 and 23 are anchored to substrate 50 at anchor points 34 and 35. In a first order approximation, the stage position is proportional to the force, which is proportional to the square of the applied voltage. Conductive heat transfer through the suspension springs sinks the waste heat from the VCSEL into the substrate. The low threshold current, characteristic for VCSELs, makes it possible to keep the temperature of the stage under control.

An important metallization /contacting issue is how to get the electrical connections for the VCSEL(s) 12 onto the mechanically suspended stage 10. In the embodiment shown, conductive line 40 is run from contact pad 42 on substrate 50 to stage 10 and to VCSEL 12. Conductive line 40 runs over the neutral fiber of suspension spring 18, and is electrically isolated from suspension spring 18. The 'neutral fiber' is the stress free centerline of the flexing spring. The width of conductive line 40 is chosen sufficiently small relative to the width of the spring and runs along the centerline of the spring in order to minimize mechanical stress, which allows conductive line 40 to survive the mechanical scanning motion of the beam. The electrical isolation of conductive line 40 from suspension spring 18 may be accomplished in many ways, for example, with a dielectric layer underneath conductive line 40 or insulating the suspension beam surface using shallow ion implantation.

Figure 2:
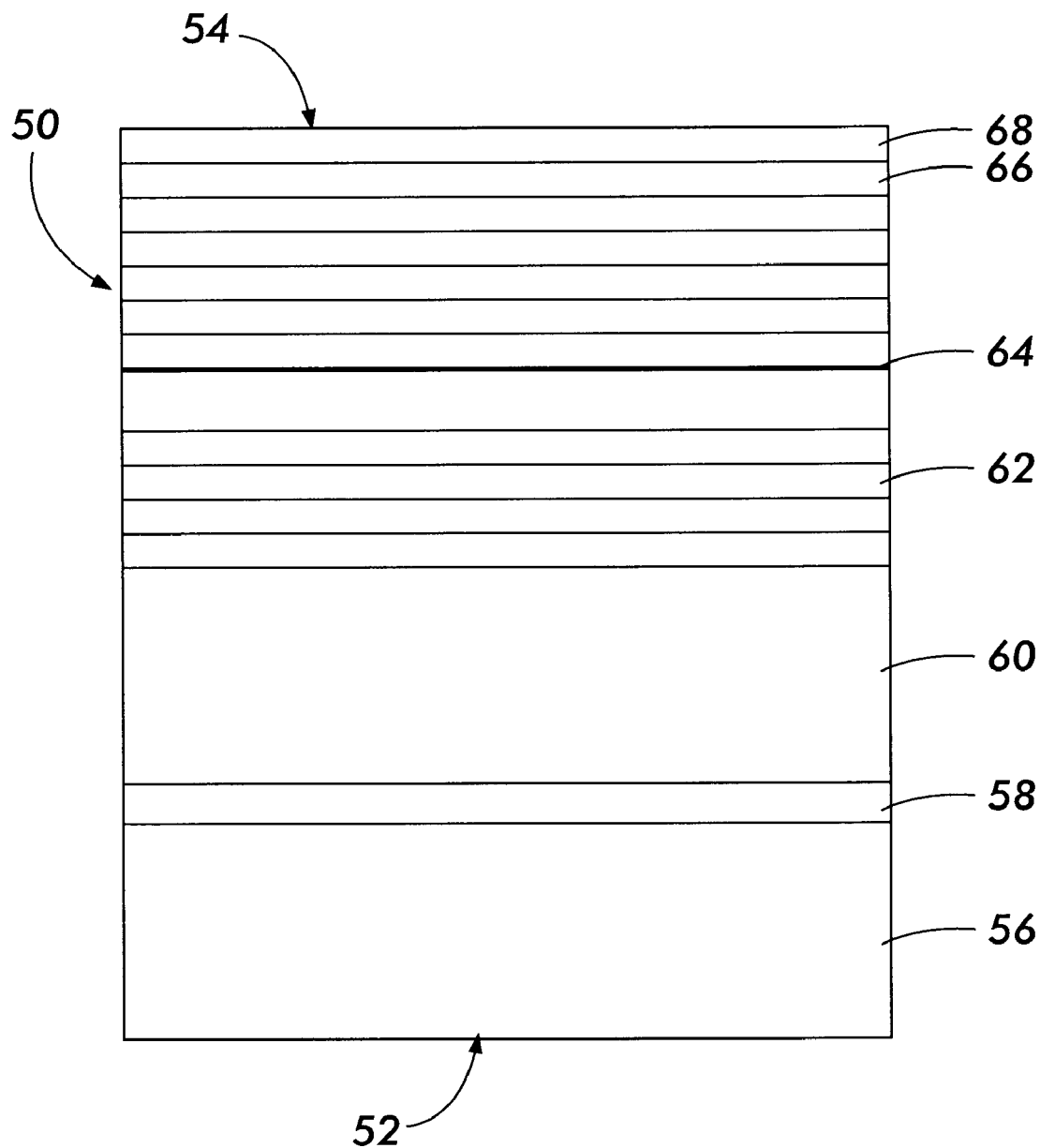
FIG. 2 shows the cross-section of the semiconductor substrate in FIG. 1 prior to any processing.

FIG. 2 is a cross-sectional view of substrate 50 having a VCSEL structure prior to any etching with substrate back side 52 and substrate front side 54. In this embodiment, the VCSEL structure includes layers of undoped III-V substrate 56, etch stop layer 58, buffer layer 60, N-type quarter wave distributed Bragg reflector (DBR) mirror layers 62, active region 64, P-type DBR mirror 66 and P+ contact layer 68. In a preferred embodiment layer 56 is an undoped GaAs substrate, etch stop layer 58 is AlAs, buffer layer 60 is N-GaAs, n-DBR layer 62 is n-$Al_xGa_{1-x}As/Al_yGa_{1-y}As$, active layer 64 is a quantum well layer sandwiched by AlGaAs potential confinement layers, P DBR layer is P-$Al_xGa_{1-x}As$(x~0.05)/$Al_yGa_{1-y}As$ (y~0.95) and P+ contact layer is GaAs.

The VCSEL structure may be formed using any well-known etching processes to form the VCSEL cavity. The semiconductor laser structure then undergoes ion implantation process for isolation and metallization. Holes flows through the p-DBR region confined by the ion implanted area and into that portion of the active layer which lies below the p-DBR cavity and recombine with electrons flowing upwards from the NDBR below and producing photon emission and optical amplification. At sufficiently high current flow, this optical amplification in combination with feedback from the DBR mirrors will result in laser oscillation and emission within the VCSEL cavity. Regions formed by the ion implantation isolation process are highly resistive.

Figure 3:
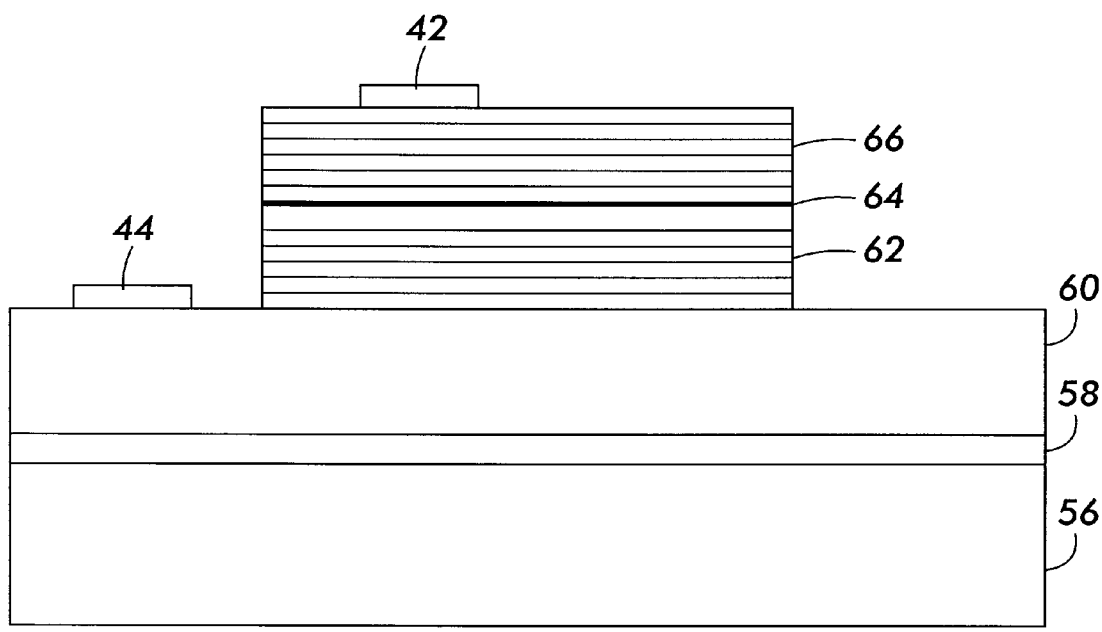
FIG. 3 shows a cross-sectional view of the light emitting assembly in FIG. 1 along line 3—3.

FIG. 3 is a cross sectional view along line 3—3 of FIG. 1, and shows the VCSEL structure described in FIG. 2 after the VCSEL structure has been processed or etched. VCSEL anode 42 has been deposited on top of the VCSEL 12 (not shown) and ground 44 has been deposited on buffer layer 60. The region under VCSEL anode 42 is ion implanted for electrical isolation to direct current flow into the active region of the VCSEL.

Figure 4:
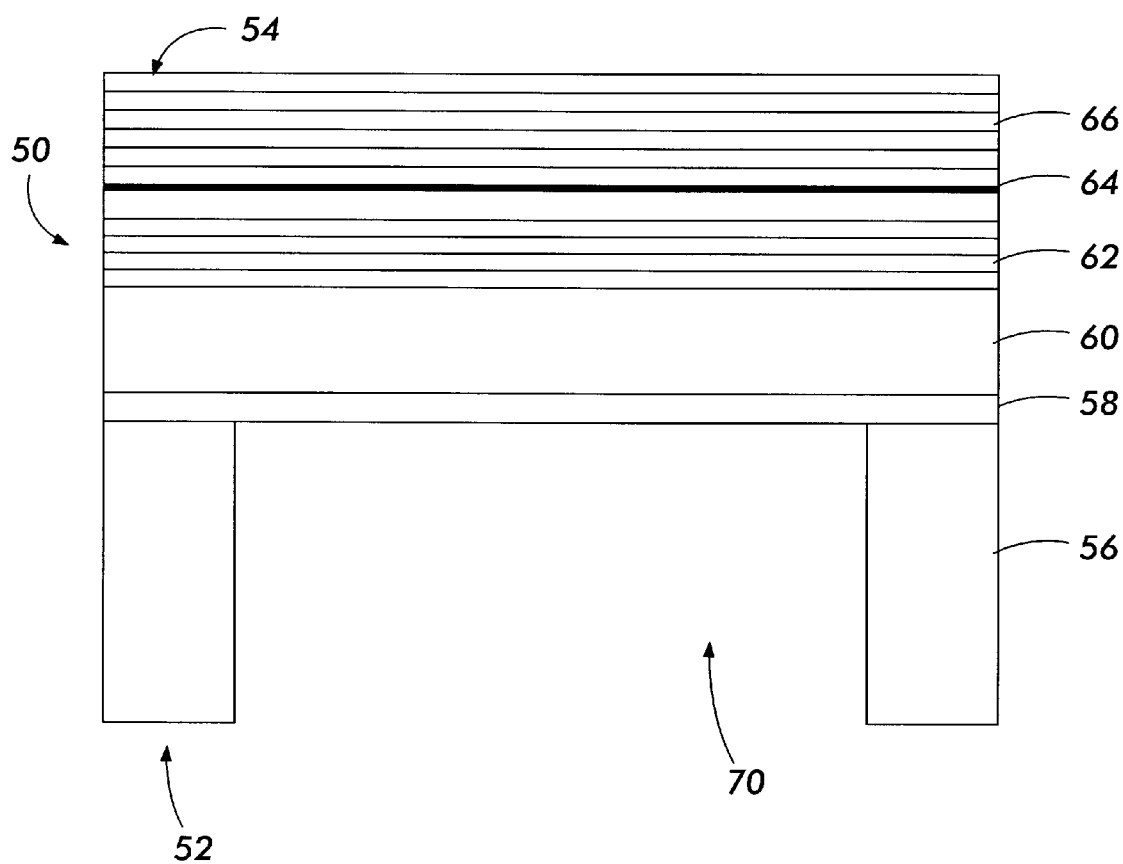
FIGS. 4 and 5 show a cross-sectional view of the movable light emitting assembly along line 4—4 of FIG. 1 using an RIE/RIE fabrication process.
Figure 5:
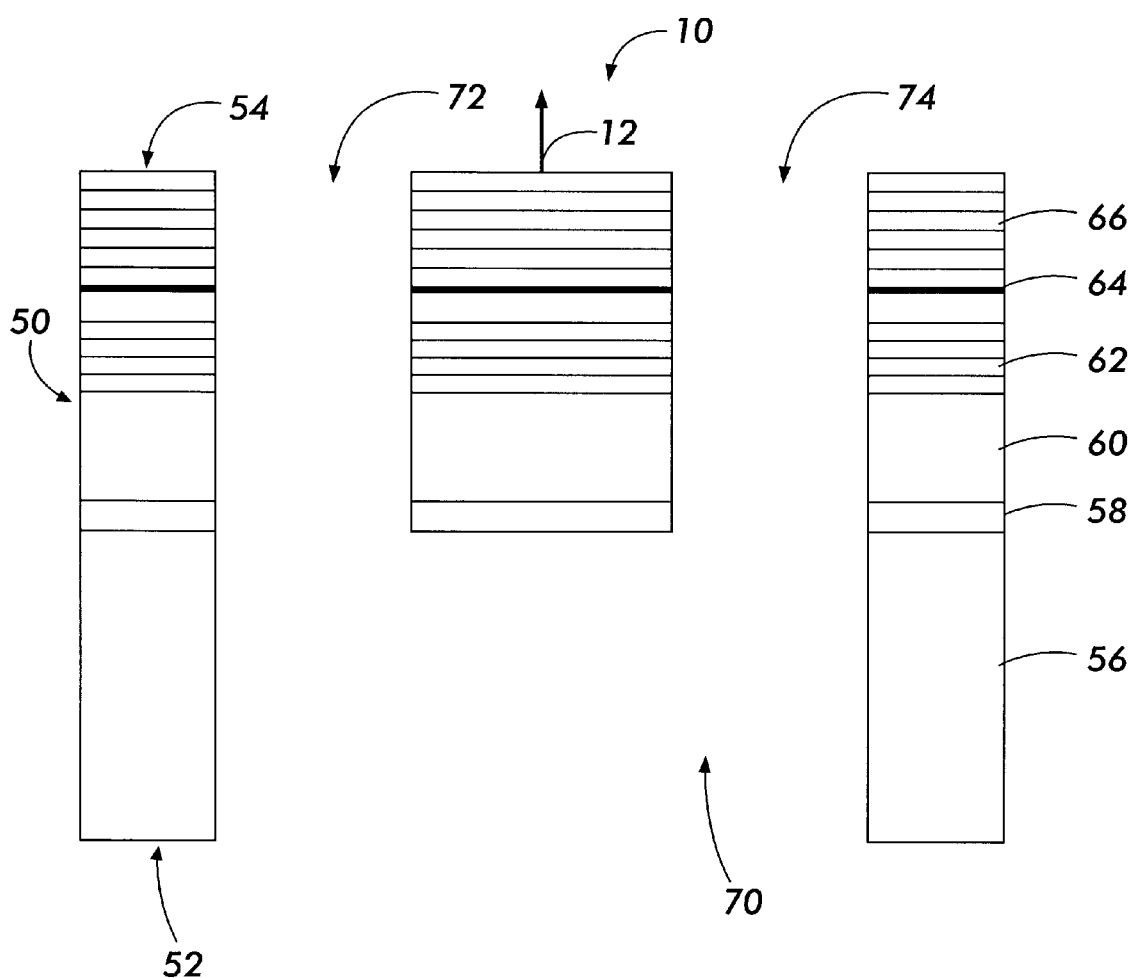

FIG. 4 is a cross-sectional view of VCSEL shuttle 1 taken along line 4—4 of FIG. 1 prior to the shuttle release etch step in which an RIE/RIE process has been used. A deep reactive ion etch from the substrate back side 52 to layer 58 is used to produce a III-V membrane with a thickness equal to the desired thickness of the stage 10, springs 16–19 and combs 20 and 21. The III-V membrane forms a bridge structure between unetched substrate portions of substrate 50 with layer 56 having substrate etched portion 70. In a second RIE step shown in FIG. 5, from substrate front side 54, the III-V membrane is perforated in the shape of stage 10, springs 16–19 (not shown) and combs 20 and 21 (not shown) with membrane etched portions 72 and 74. This step releases the unanchored structures from substrate 50 and makes them movable. The anchor points are defined in the areas where the front side etch intersects the sidewalls of the backside etch. The two etches can be post processing steps, performed after the regular VCSEL process.

Figure 6:
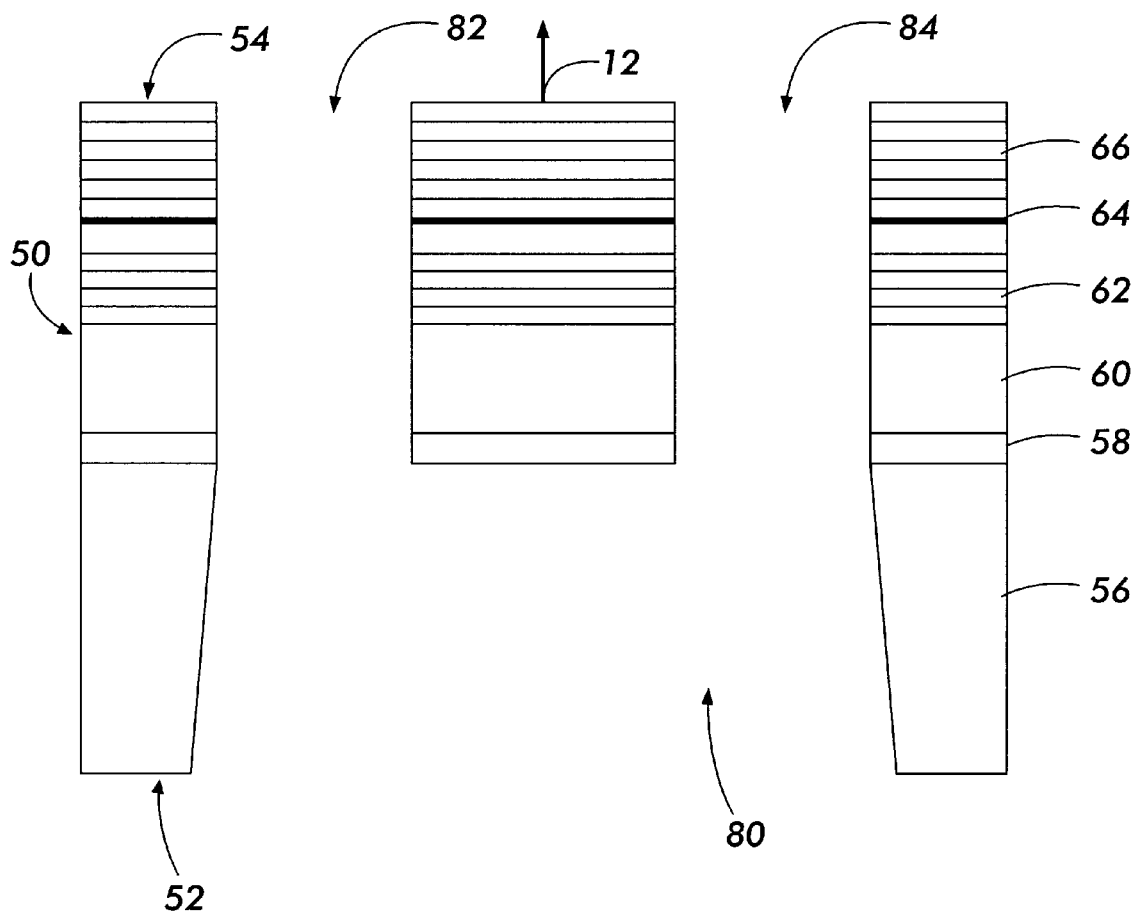
FIG. 6 shows a cross-sectional view of the movable light emitting assembly along line 4—4 of FIG. 1 in using ODE/RIE fabrication process;.

FIG. 6 is a cross-sectional view of VCSEL shuttle 1 taken along line 4—4 of FIG. 1 in which an isotropic wet etch process has been used. This process is used on the substrate back side 52 to produce the III-V membrane supported by unetched layer 56 with etched portion 80. The front side 54 etch is still RIE to form etched portions 82 and 84. In this approach, the wet etch step on the back side can be done before the VCSEL process, leaving the front side of the wafer unaffected. After the regular VCSEL process, the additional RIE step from the front side would again release the moving parts.

Figure 7:
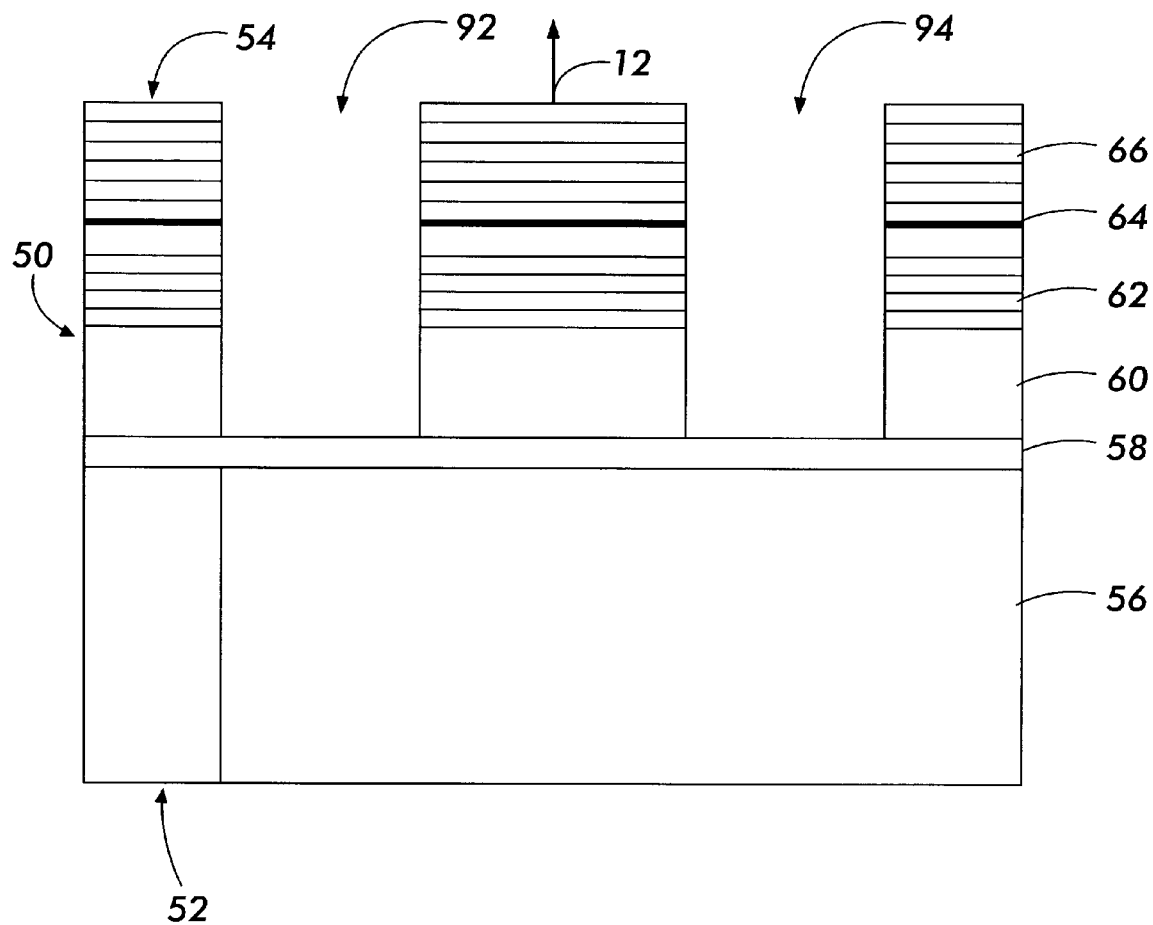
FIGS. 7 and 8 show a cross-sectional view of the movable light emitting assembly along line 4—4 of FIG. 1 using an RIE and sacrificial layer fabrication process.
Figure 8:
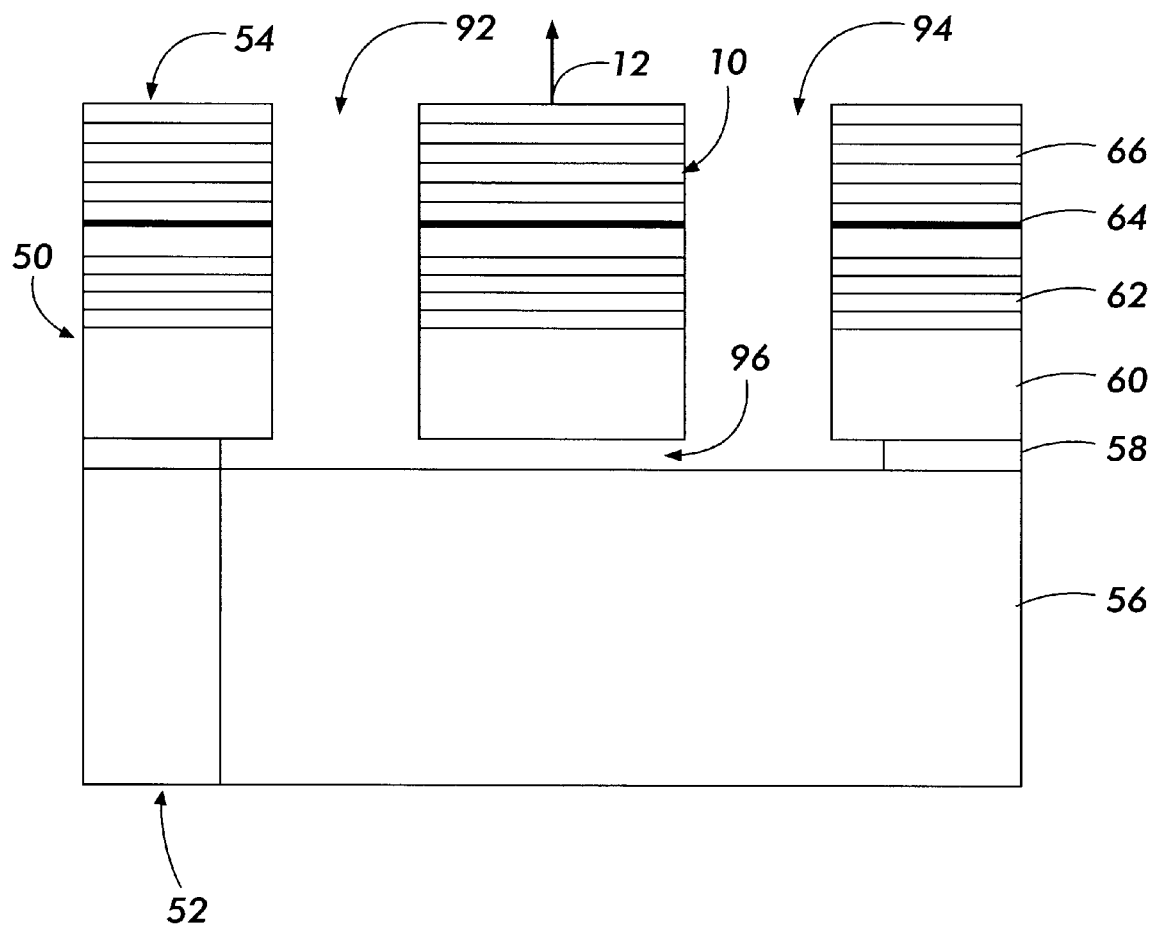

FIG. 7 is a cross-sectional view of VCSEL shuttle taken along line 4—4 of FIG. 1 which uses a 'sacrificial layer' fabrication process. This process is based on an RIE step after the VCSEL process, defining the stage, combs and springs, and with etched portions 92 and 94 exposing etch stop layer 58. FIG. 8 shows an underlying portion of etch stop layer 58 which is subsequently etched away ('sacrificed') from underneath the membrane forming etched portion 96. This releases the moving parts from substrate 50. The sacrificial etch is typically done with a wet etchant which etches the sacrificial layer material but does not etch the top layer material.

Figure 9:
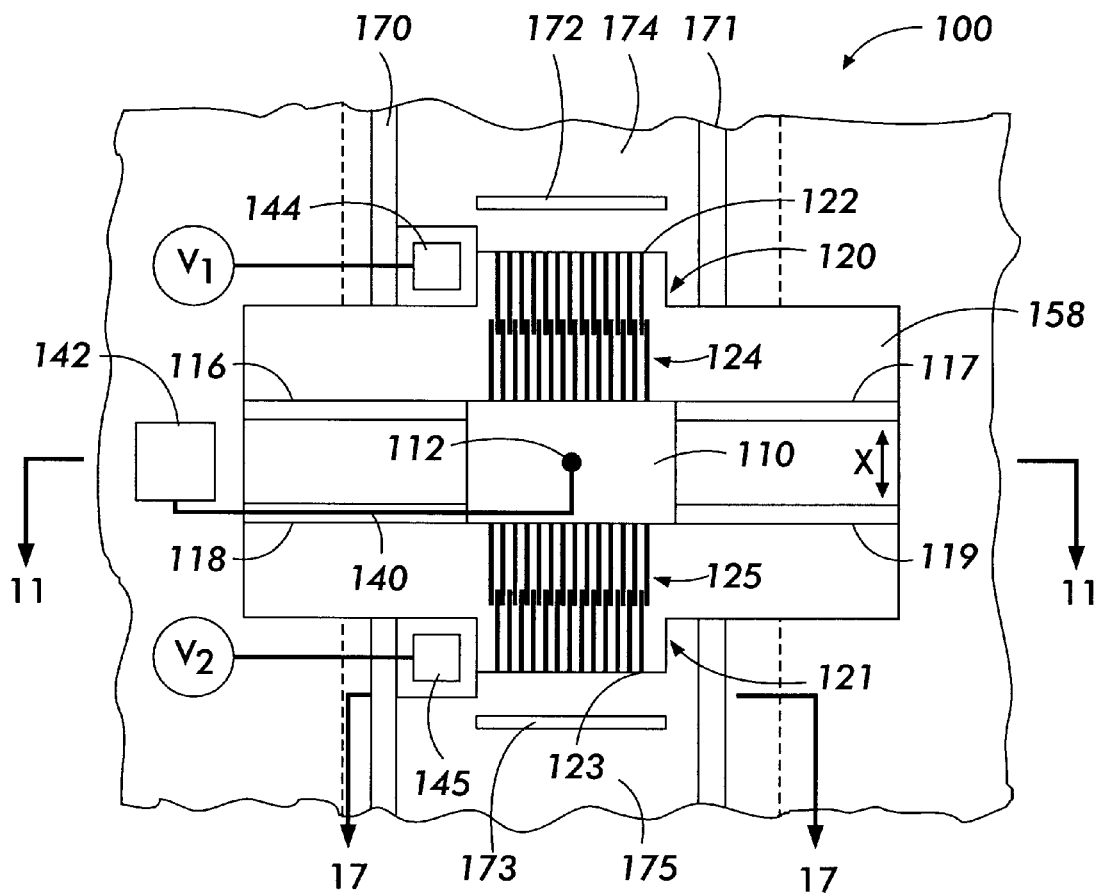
FIG. 9 shows a top view of a light emitting assembly movably supported on a doped semiconductor substrate.

FIG. 9 shows a top view of VCSEL shuttle 100 which provides for electrical isolation of comb fixed fingers 122 and comb movable fingers 124 of comb drive 120 and comb fixed fingers 123 and comb movable fingers 125 of comb drive 121. Since the fingers of each comb are of opposite polarities coupled by capacitance only, electrical isolation is needed which has to stand over 100 V electrical bias without breakdown. In one embodiment, this is realized by oxidizing layer 158 of about 500 to 1000 nm thick underneath the VCSEL structure, combined with etched isolation grooves 170 and 171 etching down to the oxidized layer. The oxidation of the AlAs layer is done through oxidation grooves 172 and 173 etched in the middle of the regions to be oxidized.

Figure 10:
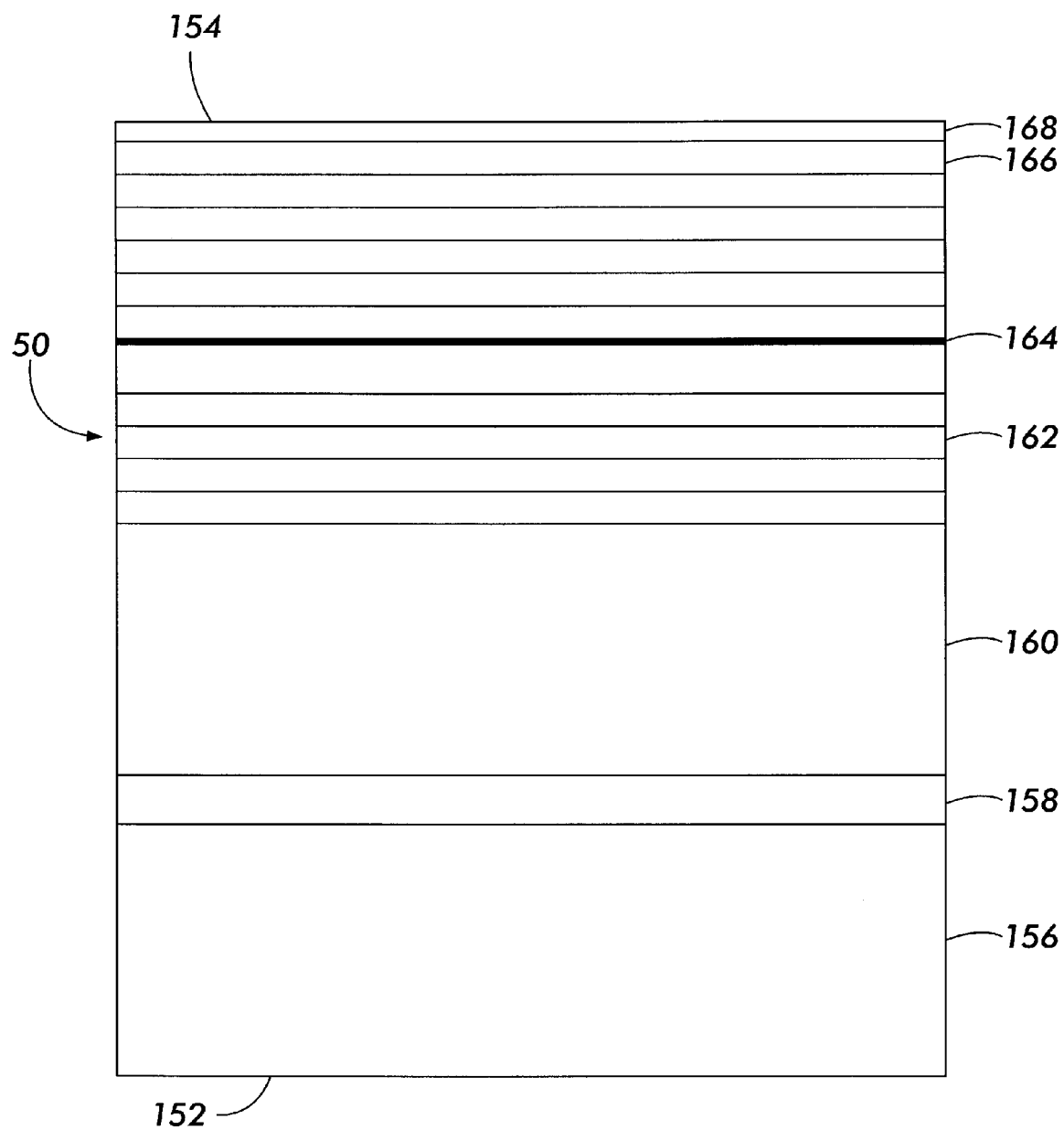
FIG. 10 shows the cross-section of the semiconductor substrate in FIG. 1 prior to any processing.

FIG. 10 is a cross-sectional view of substrate 50 having a VCSEL structure prior to any processing with substrate back side 152 and substrate front side 154. VCSEL structure includes layers of doped III-V substrate 156, etch stop layer 158, buffer layer 160, quarter wave distributed Bragg reflector (DBR) mirror layers 162, active region 164, PDBR mirror 166 and P+ contact layer 168.

Figure 11:
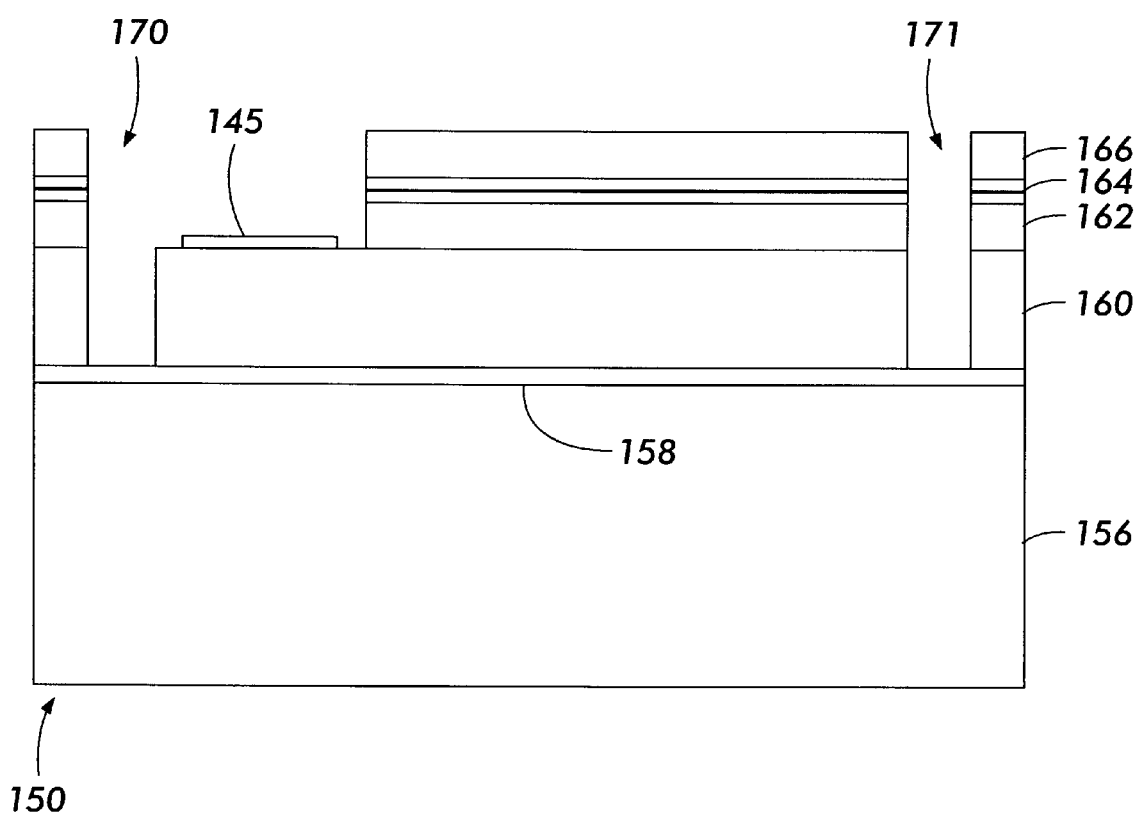
FIG. 11 shows a cross-sectional view of the light emitting assembly in FIG. 9 along line 11—11.

FIG. 11 is a cross-sectional view of the fixed comb drive region along line 11—11 shown in FIG. 9. The $AlO_x$ layer 158 extends to the tips of static fingers 123. Electrical contact pad 145 for comb drive fixed fingers 123 is deposited on top of n-GaAs buffer layer 160, so that the n-DBR layers 162 and the n-GaAs buffer layer 160 above the $AlO_x$ layer 158 can couple the electrical static force between finger sets 123 and 125. Comb movable fingers 125 are connected to the electrical ground 142 of VCSEL 112, so that no separate electrical contact is needed, which simplifies the fabrication process. When a bias is applied by $V_1$ between the comb drive fingers 122 and 124, VCSEL shuttle 100 is scanned in a linear motion as indicated by the x arrow and when a bias is applied by $V_2$ between comb drive fingers 123 and 125, VCSEL shuttle 100 is scanned in the opposite direction.

Figure 12:
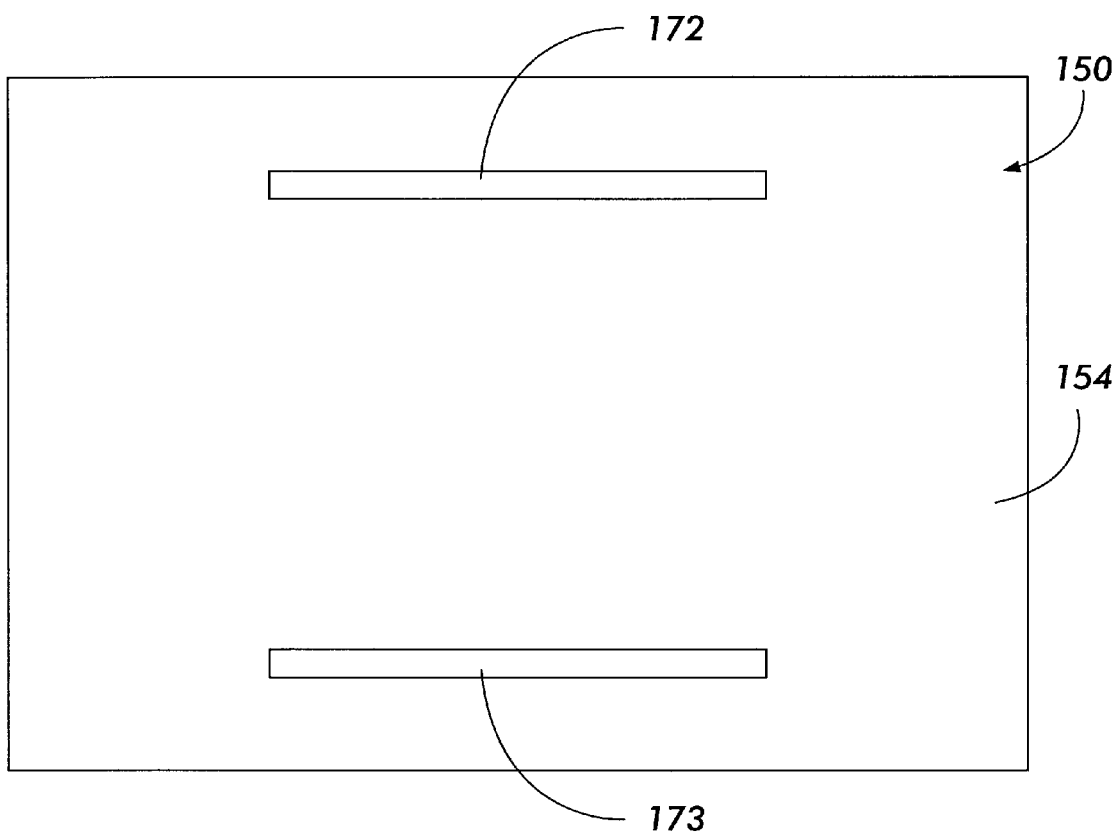
FIGS. 12–18 show top views of the processing steps used in fabricating the light emitting assembly in FIG. 9.

The VCSEL shuttle shown in FIG. 9 may be produced by many different processes, for example a process using the following steps:

FIG. 12 shows a top view of substrate 150 with oxidation grooves 172 and 173 etched from the front side 154 of layered substrate to reach the AlAs layer 158 beneath the n-GaAs buffer layer.

Figure 13:
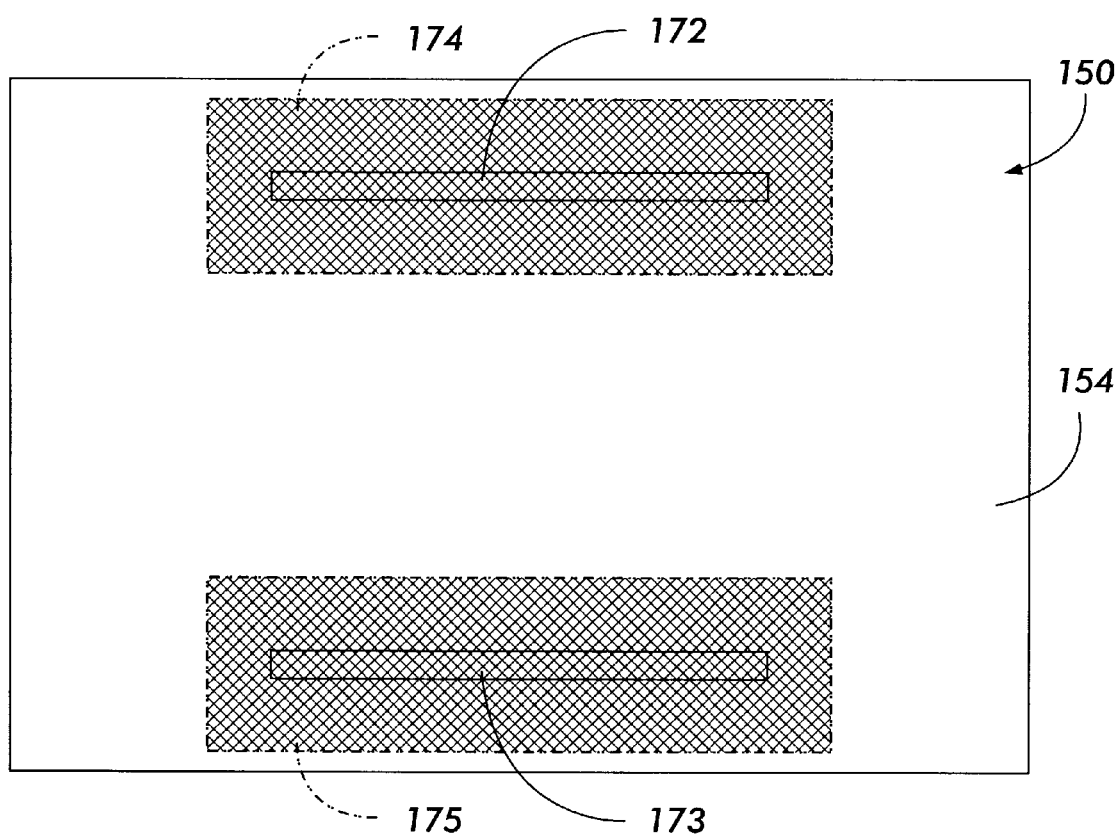

FIG. 13 shows the next step which includes oxidation of the AlAs layer to an AlOx layer to cover desired areas 174 and 175, for example, 200 um by 200 um. The oxidation area may be controlled by timing the length of the oxidation process.

Figure 14:
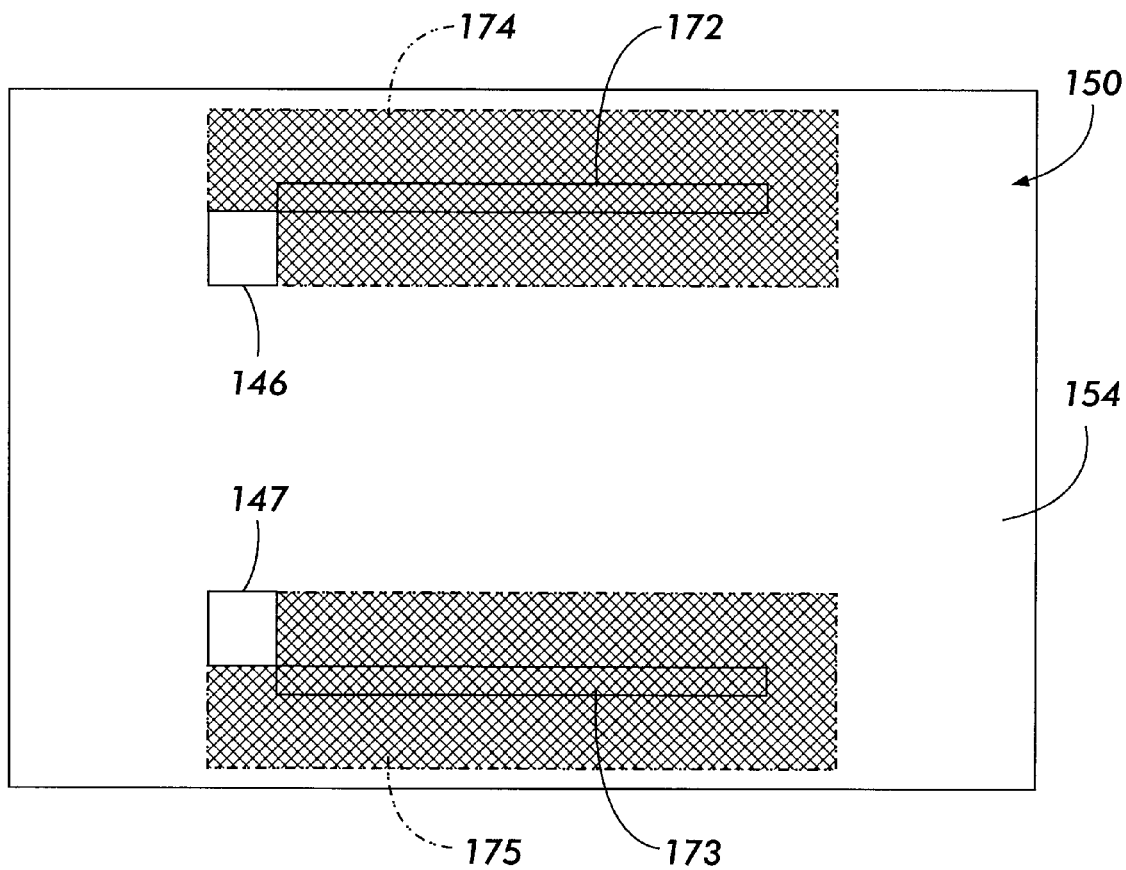

FIG. 14 shows the steps of patterning and etching to buffer layer 160 at contact areas 146 and 147 in preparation for the deposition of electrical contacts 144 and 145 for fixed comb drives.

Figure 15:
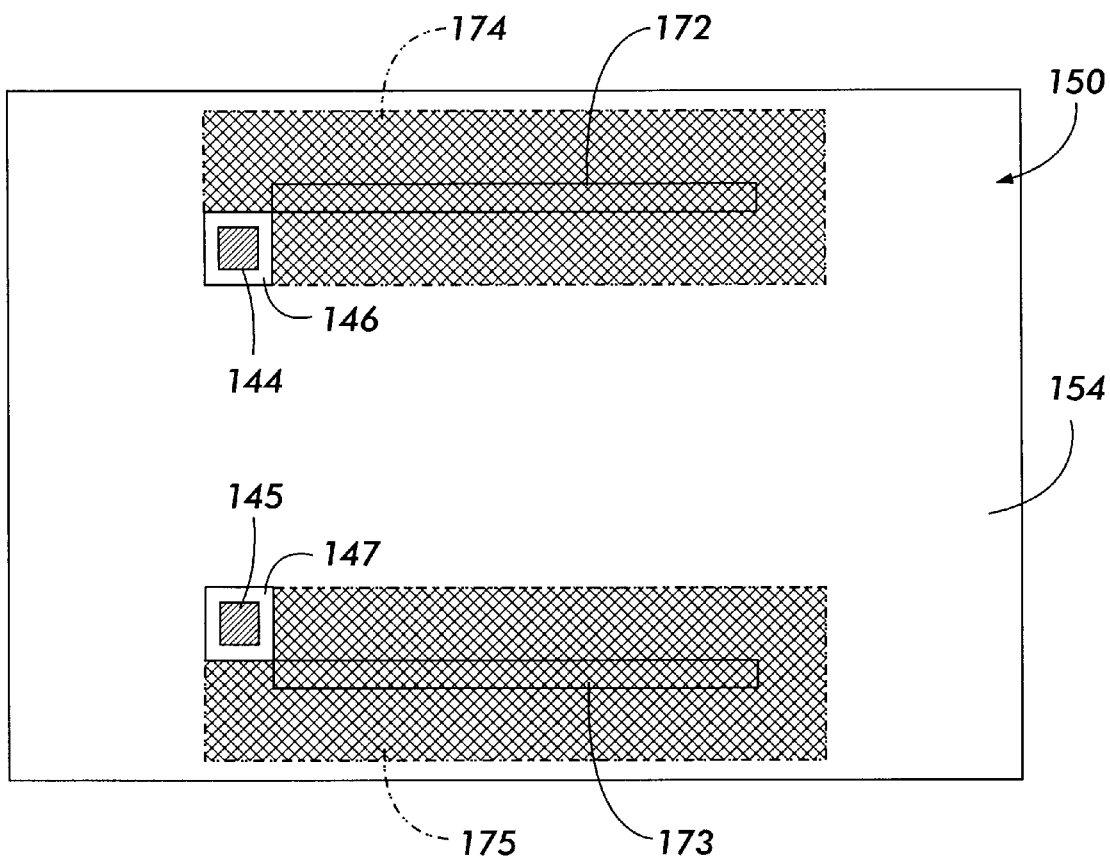

FIG. 15 shows the deposition of electrical contacts 144 and 145 onto exposed buffer layer 160.

Figure 16:
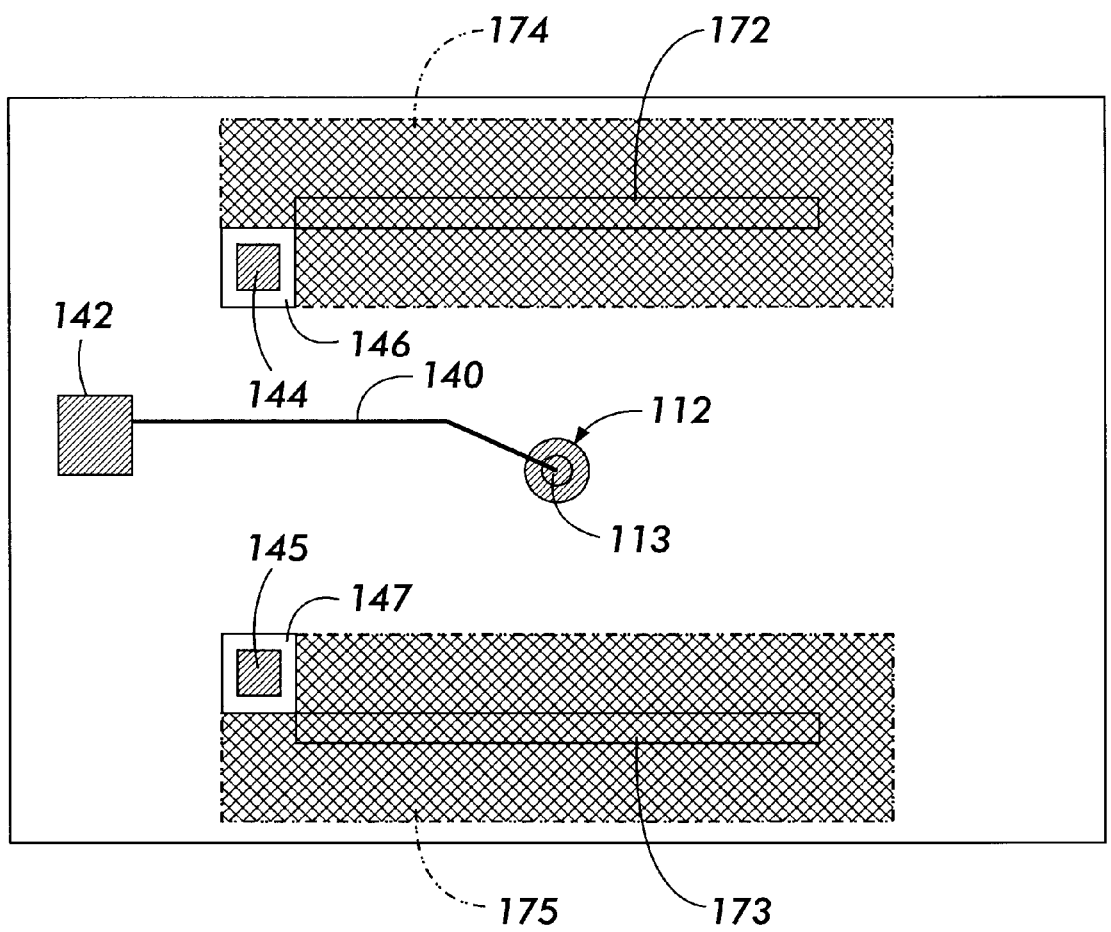

FIG. 16 shows the next step in which VCSEL 112 is fabricated with conductive line 140 connected to VCSEL contact pad 142. VCSEL 112 has VCSEL cavity 113 formed by an ion implantation process isolation process.

Figure 17:
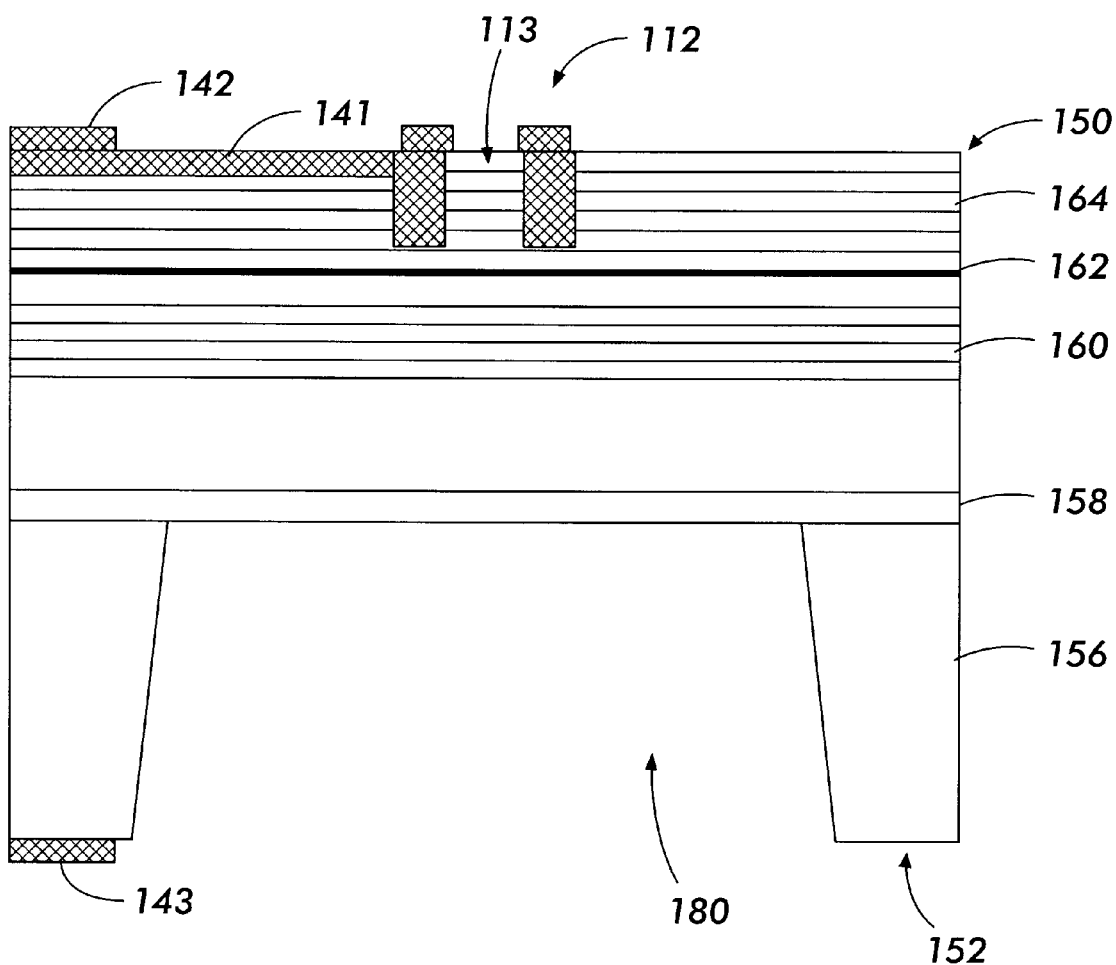

FIG. 17 shows a cross-sectional view along line 17—17 of FIG. 9 with the stage and electrostatic combs not yet etched. This figure shows the step of patterning the back 152 of substrate 150 to open a hole 180 using, for example, a spray etcher. The spray etchant of $H_2O_2$ and $NH_4OH$ mix may be used. As the pH of the mixed solution is over 6, the etchant becomes selective of GaAs over oxidation layer 158 so the etching will stop at the oxidation layer 158. Deep dry etching may be used to remove the substrate. Implantation region 141 extends underneath conductive line 140 and is insulating so that the current can only flow into the active region of the VCSEL from pad 142). Electrical contact 143 is deposited on the corner of the substrate back side 152.

Figure 18:
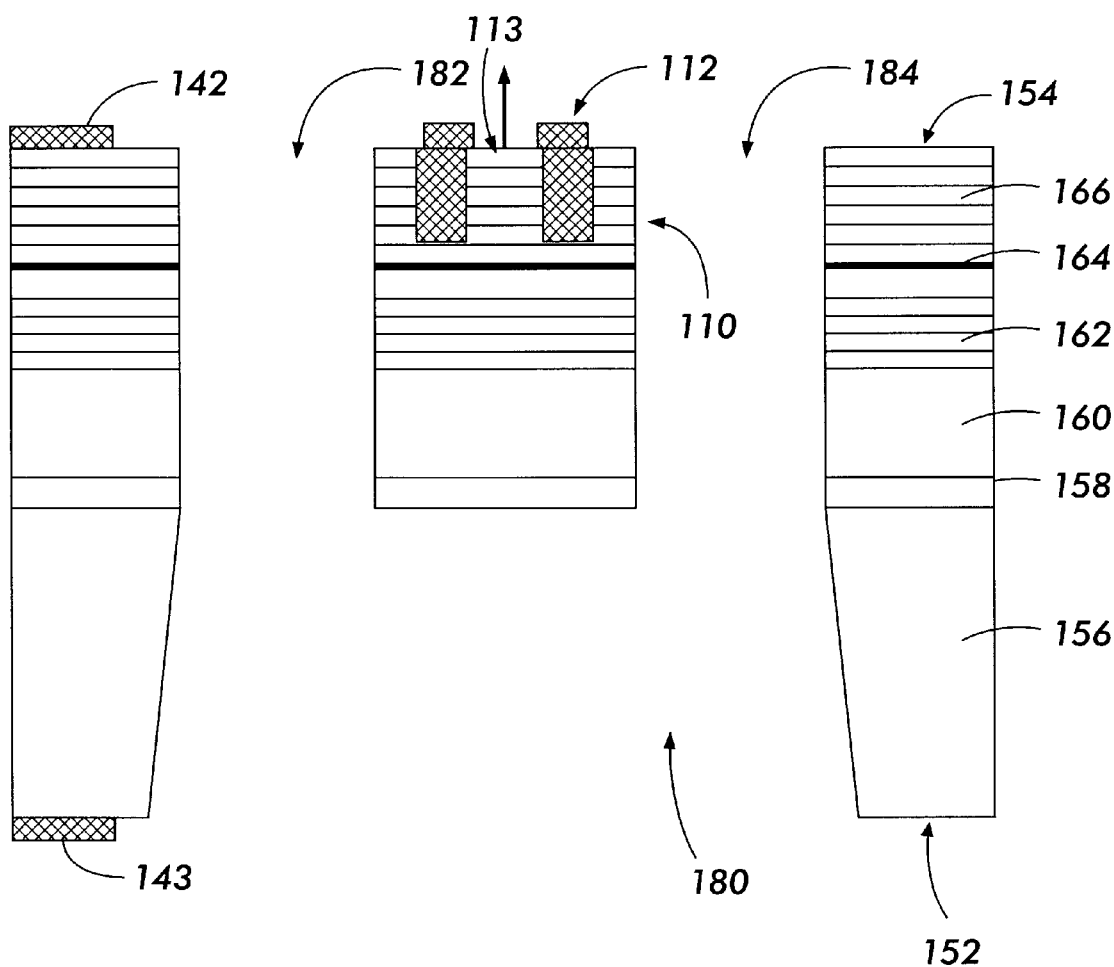

The last step is shown in FIG. 18 where patterning and etching substrate front side 154 to define finger (not shown) and shuttle features including stage 110. Preferably the etching is done with a high aspect ratio dry etching process to form the electrostatic combs. Stage 110 is attached to substrate 150 by suspension beams 116, 117, 118 and 119 as shown in FIG. 9.

The current of VCSEL 112 flows through the n-GaAs layer in the long suspended beam 118 to the n-GaAs substrate 160. To estimate the series resistance of a 30 $\mu$m wide and 450 $\mu$m long beam with a 10 $\mu$m thick n-GaAs buffer layer60, with doping density of $5 \times 18/cm^3$ and the electron mobility of 1000 $cm^2/Vs$, the resistance per beam is about 19 ohms. Considering two beams in parallel connection, the total electrical resistance is 9.5 ohms. Comparing to the series resistance of the VCSEL which is about 200 ohms typically, the added series resistance from the long suspended beam is quite small.

Since there is built-in compressive strain in the VCSEL structure due to lattice mismatch between AlGaAs and GaAs, the stage may buckle after release from the GaAs substrate. Increasing the thickness of the GaAs buffer layer will not only reduce the series resistance of the VCSEL, but will also increase the mechanical stability of the shuttle stage. Another approach to prevent the stage from buckling is depositing a layer in tensile strain on top of the stage to compensate for the built-in compressive stress. Tensile strained dielectric layers such as $SiN_x$ or $SiO_2$ may be used to accomplish this.

Figure 19:
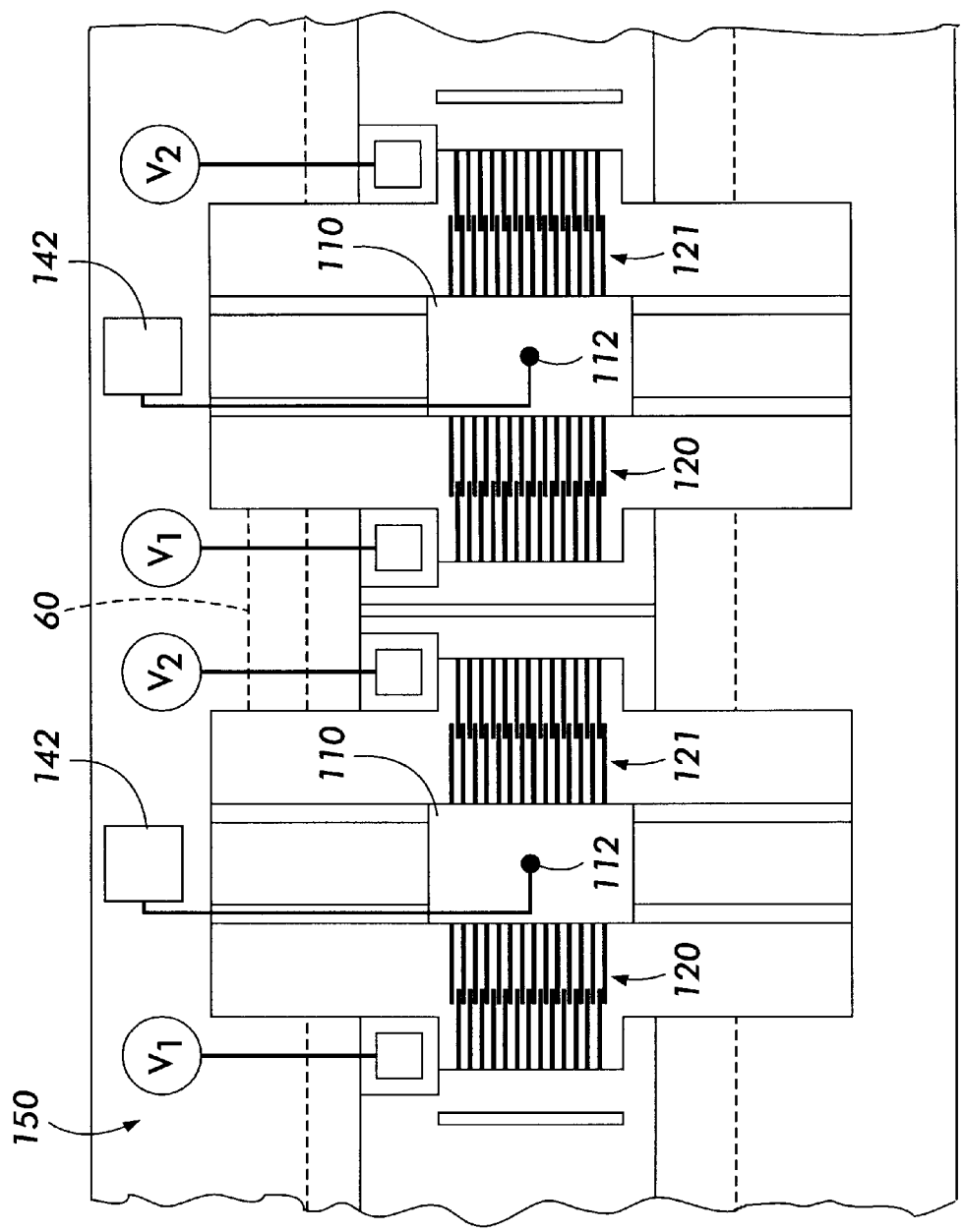
FIG. 19 shows a top view of a 1 by 2 light emitting assembly array using a plurality of the light emitting assembly in FIG. 9.

FIG. 19 shows a 1×2 scanning VCSEL array using the VCSEL structure described in FIG. 9. This pattern of multiple VCSELs can be repeated to make large linear or two-dimensional arrays. The numbers in FIG. 19 refer to the same structures as those described in FIG. 9.

The VCSEL scanners can be packaged in TO-type packages (e.g. 1 VCSEL per package, or more if desirable) with built-in short focal length lens. A 'small' stage scan length (e.g. 5 $\mu$m) can, within limits, be considerably magnified by placing the VCSEL scanner close to a short focal length lens and using a comparatively large throw distance (e.g. 1" optical scan length feasible for a 50 $\mu$m mechanical scan amplitude using a 10 inch or 20 inch throw distance (250×, 125× respectively).

Figure 20:
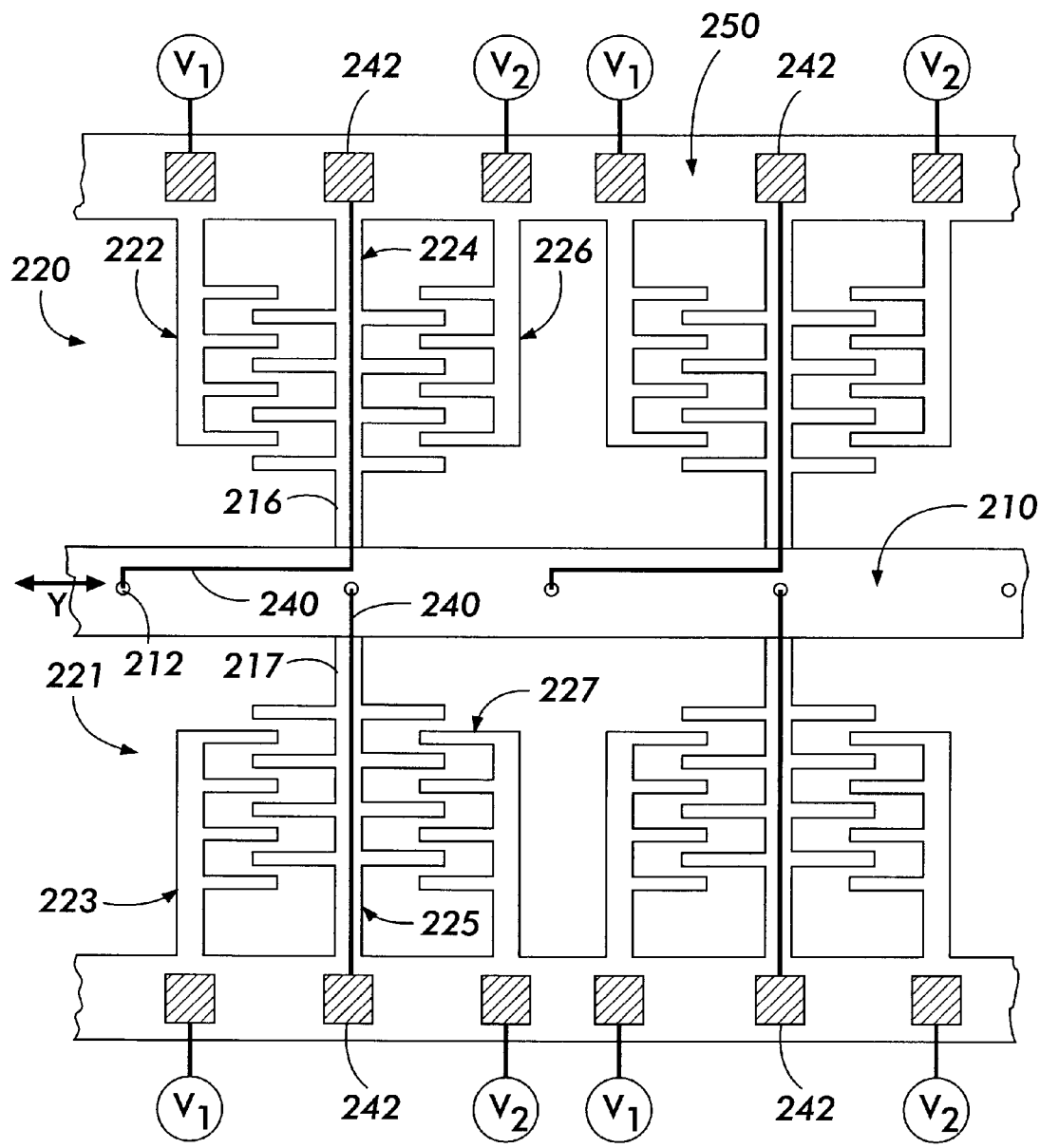
FIG. 20 shows a top view of a light emitting assembly array with a plurality of light sources.

FIG. 20 shows a segment of a III-V VCSEL scanning array with scanning stage 210 carrying multiple VCSELs 212. Only one set of comb actuators 220 and 221 will be described, however, as shown, multiple sets of combs are used to move stage 210. Comb actuator 220 includes stationary finger sets 222 and 226 and movable finger set 224 while comb actuator 221 includes stationary finger sets 223 and 227 and movable finger set 225. Movable finger sets 224 and 225 support stage 210 with suspension beams 216 and 217. Stationary finger sets 222, 226 and 223, 227 are attached to substrate 250. Voltages $V_1$ and $V_2$ supply stationary finger sets 222 and 223 with the power to actuate the comb drives 220 and 221 in the y direction shown. Each VCSEL 212 has conductive line 240 which runs from VCSEL contact pad 242 on substrate 250 over movable finger sets 224, 225 along suspension beams 216 and 217 to supply the VCSEL electrical connection. The pitch of VCSEL arrays is on the order of a hundred microns. The resonant scanning frequency is on the order of tens of kilohertz, with a displacement of over tens of micrometers. When combined with a projection optical system of seven (7) times magnification, the VCSEL array of 4 cm width is capable of covering a page width scan of 12 inches.

Figure 21:
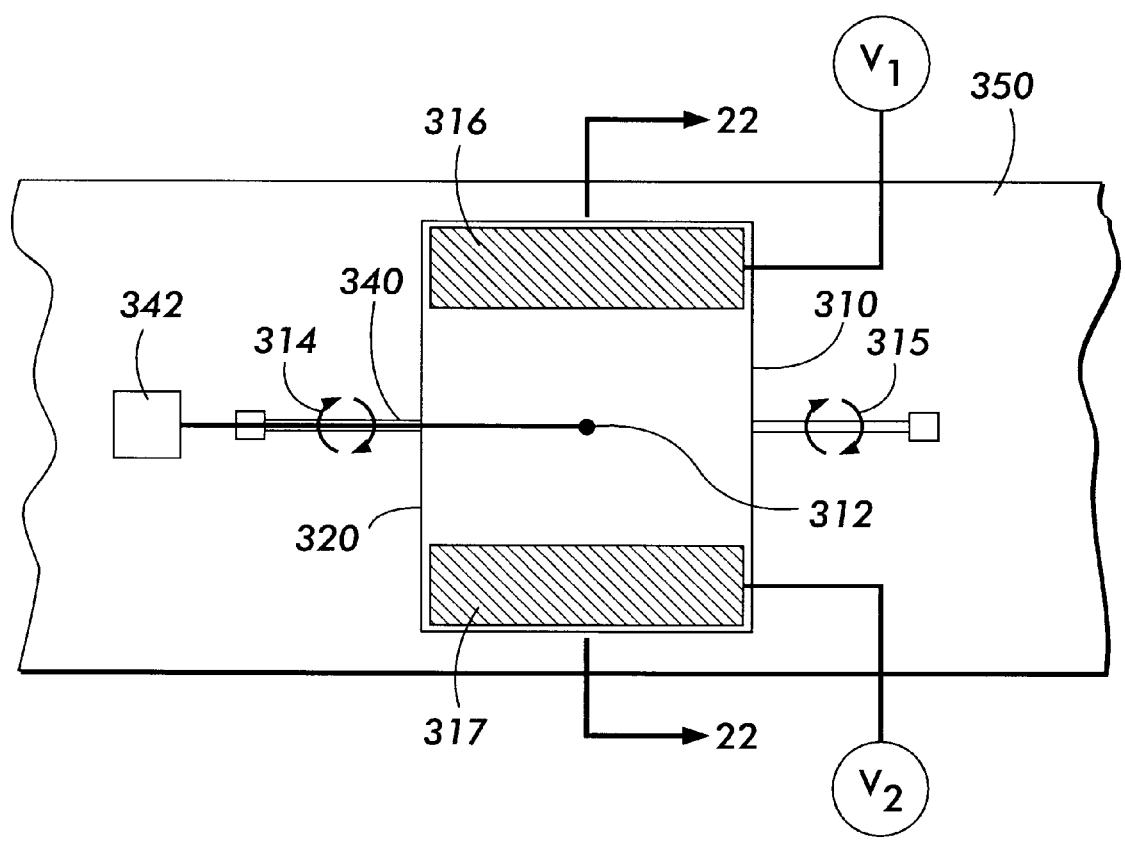
FIG. 21 shows a top view of an electrode actuated movable light emitting assembly supported on a substrate.
Figure 22:
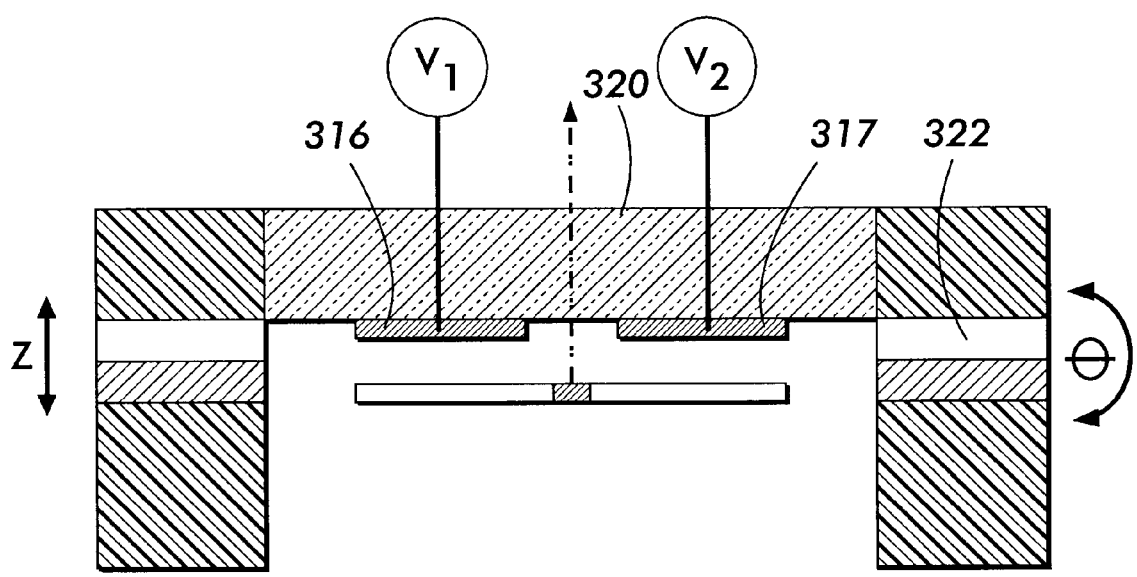
FIG. 22 shows a cross-sectional view of the electrode actuated movable light emitting assembly along line 22—22 of FIG. 21.

FIG. 21 shows a z-, or Θ-degree of freedom of VCSEL motion. VCSEL 312 is supported on stage 310. The micromachined semiconductor substrate 350 has VCSEL 312 on stage 310 suspended from suspension springs 314 and 315. The actuation is done with parallel plate capacitors formed between stage 310 and electrodes 316 and 317 on glass cover 320. "Raster Output Scanner with Pivotal Mirror for Process Direction Light Spot Position Control", U.S. patent application Ser. No. 08/761,681, filed on Dec. 6, 1996 cited earlier discloses the manufacture and operation of a pivoting mirror, the operation of moving stage 310 being similar in operation to that of the pivoting mirror. Differential actuation of electrodes 316 and 317 produces a Θ motion; common actuation of electrodes 316 and 317 produces a z-motion. The dimensions and geometry of the suspension springs can be optimized to either favor a Θ or z-degree of freedom. Conductive line 340 electrically connects VCSEL 312 with contact pad 342. FIG. 22 is a cross-sectional view of FIG. 21, along line 22—22. Glass cover 320 is supported above substrate 350 by seal 322.

As those skilled in the art will appreciate, other various modifications, extensions, and changes to the foregoing disclosed embodiments of the present invention are contemplated to be within the scope and spirit of the invention as defined in the following claims.

We claim:

1. A micro-machined movable light emitting assembly, comprising:

a substrate made of semiconductor material;

a light source;

a light source support which movably supports the light source;

a plurality of suspension members, the suspension members attached at a first end to the light source support and at a second end to the substrate thereby suspending the light support; and at least one force generator which moves the light support, wherein the light source comprises a gallium arsenide semiconductor-based vertical cavity surface emitting laser.

2. The micro-machined movable light emitting assembly as claimed in claim 1, wherein the light source support is made of a semiconductor material.

3. The micro-machined movable light emitting assembly as claimed in claim 1, wherein the suspension members are made of a semiconductor material.

4. A micro-machined movable light emitting assembly, comprising:

a substrate made of semiconductor material;

a light source;

a light source support which movably supports the light source;

a plurality of suspension members, the suspension members attached at a first end to the light source support and at a second end to the substrate thereby suspending the light support; and at least one force generator which moves the light support, further comprising:

an electrically conductive member attached at a first end to the light source and at a second end to an electrode on the substrate.

5. The micro-machined movable light emitting assembly as claimed in claim 4, wherein a suspension member supports the electrically conductive member.

6. A micro-machined movable light emitting assembly, comprising:

a substrate made of semiconductor material;

a light source;

a light source support which movably supports the light source;

a plurality of suspension members, the suspension members attached at a first end to the light source support and at a second end to the substrate thereby suspending the light support; and at least one force generator which moves the light support, wherein the light source is a VCSEL which is formed integrally with the substrate.

7. The micro-machined movable light emitting assembly as claimed in claim 1, wherein the at least one force generator is made of semiconductor material.

8. The micro-machined movable light emitting assembly as claimed in claim 7, wherein the at least one force generator is a pair of electrostatic combs each electrostatic comb having a fixed comb set attached to the substrate and a movable comb set attached to the light source support.

9. The micro-machined movable light emitting assembly as claimed in claim 1, wherein the semiconductor material in the substrate includes an undoped III-V layer.

10. The micro-machined movable light emitting assembly as claimed in claim 1, wherein the semiconductor material in the substrate includes a doped III-V layer.

11. The micro-machined movable light emitting assembly, as claimed in claim 10, further comprising:

an oxidized layer which electrically isolates the movable comb set from the fixed comb set.

12. The micro-machined movable light emitting assembly as claimed in claim 1, wherein the at least one force generator moves the light source support angularly with respect to the substrate.

13. The micro-machined movable light emitting assembly as claimed in claim 1, wherein the at least one force generator moves the light source support vertically with respect to the substrate.

14. The micro-machined movable light emitting assembly as claimed in claim 1, wherein the semiconductor material includes Gallium Arsenide.

15. An array of micro-machined movable light emitting assemblies, comprising:

a substrate made of undoped III-V material;

a plurality of light sources;

at least one light source support which movably supports the light sources;

a plurality of suspension members, the suspension members attached at a first end to the at least one light source support and at a second end to the substrate thereby suspending the at least one light support above the substrate; and at least one force generator which moves the light support, wherein the plurality of light sources comprise a plurality of gallium arsenide semiconductor-based vertical cavity surface emitting lasers.

16. A method of moving a micro-machined movable light emitting assembly, comprising:

suspending a light emitting assembly having at least one light source on a semiconductor substrate, the light emitting assembly being supported on a light source support;

actuating a first force generator which moves the light source support in a first direction; and actuating a second force generator which moves the light source support in a second direction, wherein the at least one light source comprises at least one gallium arsenide semiconductor-based vertical cavity surface emitting laser.

17. The method of moving a micro-machined movable light emitting assembly as claimed in claim 16, wherein actuating a first force generator includes applying a first voltage to a first set of electric comb actuators which moves the light source support in the first direction and actuating a second force generator includes applying a second voltage to a second set of electric comb actuators.

18. The method of moving a micro-machined movable light emitting assembly as claimed in claim 16, wherein the first and second directions are angular with respect to the substrate.

19. The method of moving a micro-machined movable light emitting assembly as claimed in claim 16, wherein the first and second direction are vertical with respect to the substrate.

20. A method of moving a micro-machined movable light emitting assembly, comprising:

suspending a light emitting assembly having at least one light source on a semiconductor substrate, the light emitting assembly being supported on a light source support;

actuating a first force generator which moves the light source support in a first direction; and actuating a second force generator which moves the light source support in a second direction, further comprising:

integrally forming the at least one light source with the light source support.

* * * * *

UNITED STATES PATENT AND TRADEMARK OFFICE
CERTIFICATE OF CORRECTION

| | | |
|---|---|---|
| PATENT NO. | : 6,116,756 | Page 1 of 1 |
| APPLICATION NO. | : 09/173329 | |
| DATED | : September 12, 2000 | |
| INVENTOR(S) | : Eric Peeters et al. | |

It is certified that error appears in the above-identified patent and that said Letters Patent is hereby corrected as shown below:

Column 1, line 7, after "on Dec. 12, 1997." insert as a new paragraph:

This invention was made with Government support under 70NANB8H4014 awarded by NIST. The Government has certain rights in this invention.

Signed and Sealed this

Seventeenth Day of April, 2007

JON W. DUDAS
*Director of the United States Patent and Trademark Office*